United States Patent
Zhao

(10) Patent No.: US 10,056,465 B2
(45) Date of Patent: Aug. 21, 2018

(54) TRANSISTOR DEVICE AND FABRICATION METHOD

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 101 days.

(21) Appl. No.: 15/187,070

(22) Filed: Jun. 20, 2016

(65) Prior Publication Data

US 2017/0365690 A1    Dec. 21, 2017

(51) Int. Cl.
  *H01L 29/66*    (2006.01)
  *H01L 21/02*    (2006.01)
  *H01L 29/78*    (2006.01)
  *H01L 29/40*    (2006.01)
  *H01L 21/28*    (2006.01)
  *H01L 21/8238*  (2006.01)

(52) U.S. Cl.
  CPC .. *H01L 29/66545* (2013.01); *H01L 21/02164* (2013.01); *H01L 21/02271* (2013.01); *H01L 21/28008* (2013.01); *H01L 21/823814* (2013.01); *H01L 29/408* (2013.01); *H01L 29/6653* (2013.01); *H01L 29/6656* (2013.01); *H01L 29/7848* (2013.01)

(58) Field of Classification Search
  CPC ......... H01L 29/66522; H01L 29/66446; H01L 21/02271; H01L 21/28008; H01L 29/7848; H01L 29/408; H01L 29/66545; H01L 29/6653
  See application file for complete search history.

(56) References Cited

U.S. PATENT DOCUMENTS

| | | | |
|---|---|---|---|
| 8,236,658 B2 * | 8/2012 | Kuan | H01L 21/823807 257/E21.431 |
| 9,318,335 B2 * | 4/2016 | Kim | H01L 21/28158 |
| 9,343,314 B2 * | 5/2016 | Loiko | H01L 21/28008 |
| 2013/0042517 A1 * | 2/2013 | Danielson | A01K 85/01 43/4.5 |

* cited by examiner

*Primary Examiner* — Thomas L Dickey
(74) *Attorney, Agent, or Firm* — Anova Law Group, PLLC

(57) ABSTRACT

Transistor devices and fabrication methods are provided. A transistor is formed by forming a dummy gate film on a substrate and doping an upper portion of the dummy gate film to form a modified film. The modified film and the remaining dummy gate film are etched to form a modified layer and a dummy gate layer on the substrate. Source/drain regions are formed in the substrate and on both sides of the dummy gate layer. A dielectric film is formed on each of the substrate, the source/drain regions, and the dummy gate layer. The dielectric film and the modified layer are planarized to provide a dielectric layer, and to remove the modified layer and expose the dummy gate layer. The dielectric film has a planarization rate lower than the modified layer, and the formed dielectric layer has a surface higher than the exposed dummy gate layer.

20 Claims, 5 Drawing Sheets

US 10,056,465 B2

TRANSISTOR DEVICE AND FABRICATION METHOD

FIELD OF THE DISCLOSURE

The present disclosure generally relates to the field of semiconductor technology and, more particularly, relates to transistor devices and methods for forming the same.

BACKGROUND

With rapid development of integrated circuit (IC) technology, semiconductor devices, such as MOS (metal oxide semiconductor) devices, in the integrated circuits continue to shrink to provide micromation and integration.

For transistors, as the sizes continue to shrink, when using silicon oxide or silicon oxynitride materials for forming a gate dielectric layer, the formed devices are unable to meet the performance requirements for the transistors. In particular, transistors formed using silicon oxide or silicon oxynitride as the gate dielectric layer may easy to generate leakage current and cause impurity diffusion issues, which affect the threshold voltage of the transistor and decrease reliability and stability of the formed transistors.

To solve the above problems, a transistor may be formed to include a high-K gate dielectric layer and a metal gate. This transistor is also called a high-K metal gate (HKMG) transistor. The HKMG transistors use high-K (high dielectric constant) materials to replace silicon oxide or silicon oxynitride to form the gate dielectric material, and use a metal material or metallic compound material to replace polysilicon gate material to form the metal gate. With reduced sizes, the HKMG transistors may be able to reduce: leakage current, and the operating voltage and power consumption, and to improve performance of the transistors.

However, the HKMG transistors formed by such a gate-last process may have poor morphologies and undesirable performance.

BRIEF SUMMARY OF THE DISCLOSURE

According to various embodiments, there is provided a method for forming a transistor by forming a dummy gate film on a substrate. An upper portion of the dummy gate film is doped to be converted into a modified film on a remaining dummy gate film. The modified film and the remaining dummy gate film are etched to expose a surface of the substrate to form a modified layer and a dummy gate layer on the substrate. A first sidewall spacer is formed on a sidewall surface of each of the dummy gate layer and the modified layer. Source/drain regions are formed in the substrate and on both sides of the first sidewall spacer and the dummy gate layer. A dielectric film is formed on each of the substrate, the source/drain regions, and the dummy gate layer. The dielectric film and the modified layer are planarized to provide a dielectric layer, and to remove the modified layer and expose the dummy gate layer. The dielectric film has a planarization rate lower than the modified layer, and the formed dielectric layer has a surface higher than the exposed dummy gate layer.

According to various embodiments, there is also provided a transistor device formed by the above method. In the method, a dummy gate film is formed on a substrate. An upper portion of the dummy gate film is doped to be converted into a modified film on a remaining dummy gate film. The modified film and the remaining dummy gate film are etched to expose a surface of the substrate to form a modified layer and a dummy gate layer on the substrate. A first sidewall spacer is formed on a sidewall surface of each of the dummy gate layer and the modified layer. Source/drain regions are formed in the substrate and on both sides of the first sidewall spacer and the dummy gate layer. A dielectric film is formed on each of the substrate, the source/drain regions, and the dummy gate layer. The dielectric film and the modified layer are planarized to remove the modified layer and expose the dummy gate layer and to provide a dielectric layer. The dielectric film has a planarization rate lower than the modified layer, and the formed dielectric layer has a surface higher than the exposed dummy gate layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides a transistor device and fabrication method thereof. The disclosed transistor device can provide desirable morphologies, precise dimensions, and stable performance.

Figure 1:
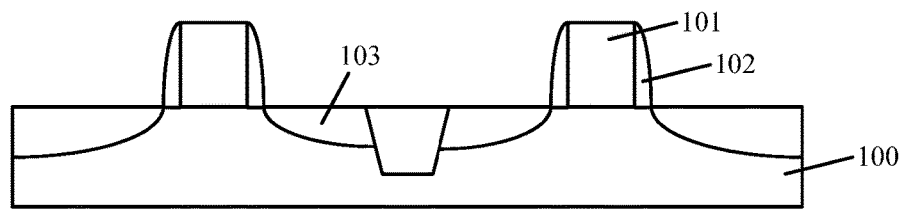
FIGS. 1-3 illustrate cross-sectional structures of an exemplary high-K metal gate structure at various stages during its formation in consistent with various disclosed embodiments.
Figure 2:
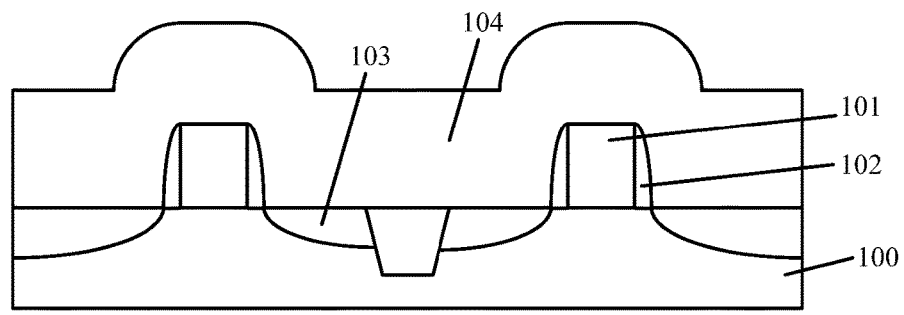
Figure 3:
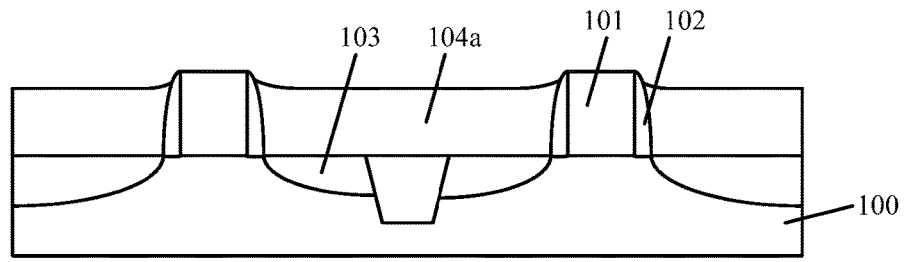

FIGS. 1-3 illustrate cross-sectional structures of an exemplary high-K metal gate (HKMG) structure at various stages during its formation consistent with various disclosed embodiments.

In FIG. 1, a substrate 100 is provided. A dummy gate structure is formed on surface of the substrate 100. The dummy gate structure includes dummy gate electrode layer 101 and sidewall spacer 102 located on the sidewall surface of the dummy gate electrode layer 101. Source/drain regions 103 are formed in the substrate 100 on both sides of the dummy gate structure.

In FIG. 2, a dielectric film 104 is formed on the substrate 100 and the dummy gate structure.

In FIG. 3, the dielectric film 104 may be polished by a chemical mechanical polishing (CMP) process to expose a top surface of the dummy gate structure (e.g., the top surface of the dummy gate electrode layer 101) to form the dielectric layer 104a.

The dummy gate electrode layer 101 may then be removed to provide an opening. A high-K gate dielectric layer may be formed in the opening. A metal gate may be formed on the high-K gate dielectric layer in the opening.

In one embodiment, the CMP process performed on the dielectric film 104 may be stopped at the top surface of the dummy gate electrode layer. However, because the dummy gate electrode layer 101 is typically made by polysilicon, while the dielectric film 104 is typically made by silicon oxide, a large planarization (or polishing) selectivity ratio may be between the dummy gate electrode layer 101 and dielectric film 104. In addition, a planarization rate (or a polishing rate) of the dummy gate electrode layer 101 is far smaller than the dielectric film 104. For at least this reason, when the CMP process is stopped at the top surface of the dummy gate electrode layer 101, the surface of the dielectric layer 104a may be overly polished, which may generate surface recesses or indentations on surface of the dielectric layer 104a, with respect to the dummy gate electrode layer 101.

When subsequently forming a metal gate, surface of the dielectric layer 104a may be used to stop the CMP process. As a result, a thickness of the subsequently formed high-K gate dielectric layer and metal gate may be less than the thickness of the dummy gate electrode layer 101. It is difficult to precisely control the size of the metal gate.

In addition, because the dielectric layer 104a has surface recesses with respect to the dummy gate electrode layer 101, residue metal material may be left on the surface of the dielectric layer 104a when subsequently forming the metal material on the dielectric layer 104a to fill the opening to form the metal gate. The residue metal material may cause short connections between metal gates of adjacent transistors. The formed transistors may, thus, have unstable performance and poor reliability.

Further, because the density between the dummy gate structures (e.g., between adjacent dummy gate structures) on the substrate or the density between semiconductor devices (e.g., between adjacent semiconductor devices) may be different, the dielectric layer 104a formed after the CMP process from the dielectric film 104 may have a surface lower than a surface of the dummy gate electrode layer 101 with a different distance there-between. For example, when the density between devices is high, i.e., a distance between adjacent dummy gate structures or a distance between adjacent semiconductor devices is short, a distance of the dielectric layer 104a lower than the surface of dummy gate electrode layer 101 may be short. When the density between devices is low, i.e., a distance between adjacent dummy gate structures or a distance between adjacent semiconductor devices is long, a distance of the dielectric layer 104a lower than the surface of dummy gate electrode layer 101 may be long. As such, a distance of dielectric layer 104a between any adjacent devices may be different, and thus the thickness of the subsequently formed high-K gate dielectric layer and metal gate formed in openings within the dielectric layer 104a may be different. The formed transistors may then have unstable performance and poor reliability.

The present disclosure provides a transistor and a method for forming the transistor. For example, after forming a dummy gate film used for forming a dummy gate layer on surface of a substrate, an upper portion of the dummy gate film may be ion-doped to form a modified film. After subsequently forming a dielectric film between the substrate and the dummy gate layer, a planarization process may be conducted on the modified film to form a modified layer with a planarization rate greater than that conducted on the dielectric film to form a dielectric layer. As a result, the dielectric layer may have a surface above the surface of the formed dummy gate layer. Thickness of the dielectric layer will not be overly thinned, relative to the total thickness of the dummy gate layer and the modified layer. Recesses formed on the dielectric layer with respect to the dummy gate layer can be avoided. After subsequent removal of dummy gate layer and during formation of the gate electrode layer, metal materials may not be remained or resided on surface of the dielectric layer. Short contact between gate electrode layers of adjacent transistors may not be generated. In addition, because thickness of the dielectric layer relative to the total thickness of the dummy gate layer and the modified layer is not overly thinned, this can ensure, after the subsequent removal of the dummy gate layer, thickness of the gate dielectric layer, formed in the dielectric layer, and the gate electrode layer can be accurately controlled to provide the transistor with desirable morphologies, homogeneously stable performance, and improved reliability.

For the above-mentioned objects, features and advantages of the present invention can be more fully understood with reference to the following specific embodiments of the present invention have described in detail.

FIGS. 4-13 illustrate cross-sectional structures of an exemplary transistor at various stages during its formation consistent with various disclosed embodiments.

Figure 4:
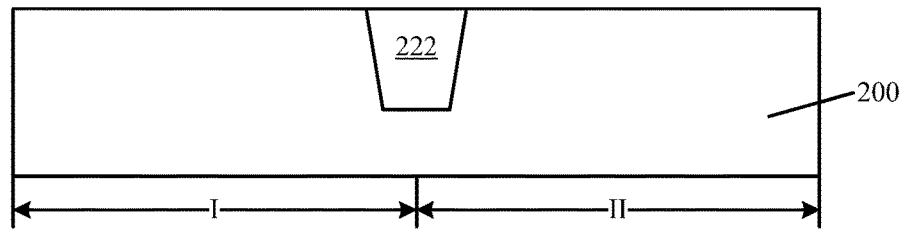
FIGS. 4-13 illustrate cross-sectional structures of an exemplary transistor at various stages during its formation in consistent with various disclosed embodiments.

In FIG. 4, a substrate 200 is provided.

In one embodiment, the substrate 200 may include a first region I and a second region II. In some cases, the first region I and the second region II may be adjacent with each other. In some cases, the first region I and the second region II may not be adjacent with each other. In one embodiment, the first region I and the second region II may be adjacent with each other. An isolation layer 222 may be formed in the substrate 200 as shown in FIG. 4. The isolation layer 222 may be made of a material including, e.g., silicon oxide, silicon oxynitride, and/or low-K dielectric material.

In one embodiment, the first region I of the substrate 200 may be used for forming a PMOS transistor, and the second region II of the substrate 200 may be used for forming an NMOS transistor. In another embodiment, the first region of the substrate 200 may be used for forming core device(s), and the second region II of the substrate 200 may be used for forming the peripheral device(s) including, for example, an input-output (I/O) device. The second region II may have a device density lower than the first region I.

In another embodiment, the substrate 200 is a planar substrate. The substrate 200 may be, for example, a silicon substrate, a silicon germanium substrate, a silicon carbide substrate, a silicon-on-insulator (SOI) substrate, germanium-on-insulator (a GOI) substrate, a glass substrate, and/or a Group III-V compound substrate (e.g., a GaN substrate and/or a GaAs substrate). The isolation layer 222 in the substrate 200 may include shallow trench isolation (STI) structures.

In another embodiment, the substrate 200 may include: a base substrate, a fin on surface of the base substrate and an isolation layer on surface of the base substrate. The isolation layer may cover a portion of the sidewall of the fin. The isolation layer may have a surface lower than a top surface of the fin. Subsequently the formed dummy gate electrode layer may be formed across the fin. The dummy gate electrode layer may also cover a portion of top surface and a sidewall surface of the fin. When subsequently using the gate electrode layer to replace the dummy gate electrode layer, the gate electrode layer can be formed across a surface of the fin and can partially cover the top and sidewall surfaces of the fin.

In one embodiment, the substrate and the fins may be formed by etching a semiconductor substrate. The semiconductor substrate may be a silicon substrate, a silicon germanium substrate, a silicon carbide substrate, a silicon-on-insulator (SOI) substrate, and/or a germanium-on-insulator (GOI) substrate. By partially etching the semiconductor substrate, a plurality of trenches can be formed in the semiconductor substrate, semiconductor material of the semiconductor substrate between the adjacent trenches may form the fin. The semiconductor material of the semiconductor substrate at the bottom of the fins may form a base substrate.

In another embodiment, the fin may be formed by an epitaxial process on the surface of the substrate. The substrate may be a silicon substrate, a silicon germanium substrate, a silicon carbide substrate, a silicon-on-insulator (SOI) substrate, and/or a germanium-on-insulator (GOI) substrate. The fins may be made of a material including silicon, silicon germanium, germanium, and/or silicon carbide.

Figure 5:
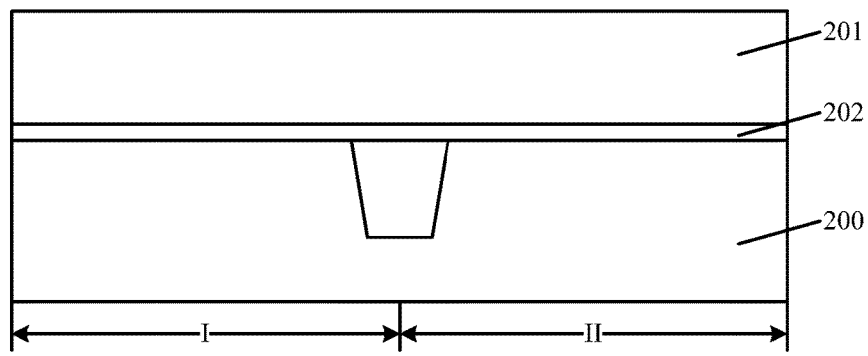

In FIG. 5, a dummy gate film 201 is formed on the substrate 200.

The dummy gate film 201 may be used to form a dummy gate layer. The dummy gate layer may occupy certain space and position for subsequently forming gate electrode layer and gate dielectric layer. For example, the dummy gate layer may be subsequently replaced by a gate dielectric layer formed by a high-K dielectric layer and gate electrode layer formed by a metal material.

The dummy gate film 201 may be made of a material including polysilicon, amorphous silicon, amorphous carbon, and/or silicon. The dummy gate film 201 may be formed by a chemical vapor deposition process, a physical vapor deposition process, and/or an atomic layer deposition process. The dummy gate film 201 may have a thickness of about 500 angstroms to about 1500 angstroms. The thickness of the dummy gate film 201 determines a thickness of the subsequently formed gate electrode layer.

In one embodiment, before forming the dummy gate film 201, a dummy gate dielectric film 202 may be formed on the surface of the substrate 200. The dummy gate film 201 may then be formed on the surface of the dummy gate dielectric film 202. The dummy gate dielectric film 202 may be made of a material including a silicon oxide. The dummy gate dielectric film 202 may be formed by a thermal oxidation process, an ISSG (in-situ steam generation) oxidation process, and/or a chemical vapor deposition process. The dummy gate dielectric film 202 may be used for forming a dummy gate dielectric layer. When subsequently removing the dummy gate layer after forming the dielectric layer, the dummy gate dielectric layer can be used to protect the surface of the substrate to avoid excessive damages to the substrate during the etching process to remove the dummy gate layer. Thus the stable performance of the formed transistors can be assured.

Figure 6:
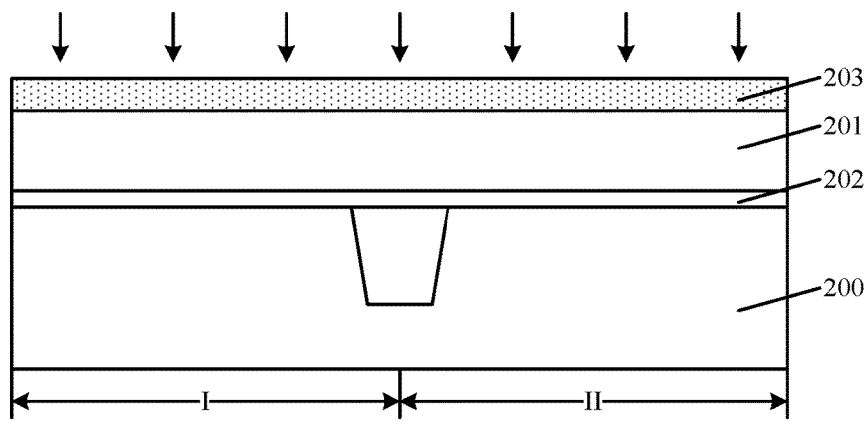

In FIG. 6, the surface of the dummy gate film 201 may be ion-doped, so that an upper portion from the surface and/or a partial region of the surface (i.e., a surface portion), of the dummy gate film 201 may be converted into a modified film 203.

By doping ion(s) into the film dummy gate surface 201, crystal lattice states in the upper portion of the dummy gate film 201 may be destroyed to generate loose lattice structure in the upper portion from the surface, i.e., in the modified film 203. In this case, in a subsequently planarization process, a planarization rate for planarizing the dummy gate film 201 may be increased over a planarization rate for planarizing the dielectric film, which allows the formed dielectric layer to have a surface higher than the surface of the dummy gate layer. This can help avoid, during formation of the gate electrode layer after subsequent removal of dummy gate layer, metal materials from remaining on surface of the dielectric layer. Short contact between gate electrode layers of adjacent transistors can be prevented. The formed transistor may have stable performance.

The ion doping process performed on surface of the dummy gate film 201 may include an ion implantation process and/or a plasma doping process. Parameters used during the ion implantation process or the plasma doping process may include: a doping gas including B, $BF_2$, P, Ge, As, $N_2$, C, or a combination thereof; a doping depth of about 10 angstroms to about 200 angstroms; a doping concentration greater than 1E15 atoms/$cm^3$. In addition, the doping energy of the ion implantation process or the power used in the plasma power can be determined according to types of the doped ions. When the doping gas is B, $BF_2$, P, As, $N_2$, and/or C, the dopant ions may have a doping energy less than or equal to about 5 keV; and when the dopant ion is Ge, the doping energy of the dopant ions may be less than about 40 keV.

The doping energy of the doped ions determines the doping depth. For example, the greater the doping energy of the doped ions, the deeper the doped ions. However, when the doped depth is too deep, the modified film 203 cannot be completely removed during the subsequent planarization process to form the dielectric layer, which may affect an etching rate during a subsequent removal of dummy gate layer. As such, in one embodiment, the doping depth may be about 50 angstroms to about 200 angstroms. In other words, the formed modified film 203 may have a thickness of about 50 angstroms to about 200 angstroms, in order to ensure that the subsequent planarization process can completely remove the modified film 203, and to expose a surface of the dummy gate layer, which may or may not have doped ions.

In the ion implantation process or the plasma doping process, the higher the doping concentration of the doped ions, the greater the planarization rate of the modified film 203 can be during planarization for forming the dielectric layer, which ensures that the dielectric layer can be formed having a surface above the dummy gate layer. Secondly, the lower the doping energy of the doped ions, the better for the doped ions to be concentrated in the upper portion of dummy gate film 201 to allow a thin thickness of the modified film 203. In addition, dopant ions with a larger mass may be selected, in order to fully destroy the lattice structures of the modified film 203 to increase the planarization rate of the modified film 203 in the process when subsequently planarizing the dielectric film. For example, ions having a larger mass may include As and/or Ge ions, which may be selected and used as disclosed herein. In addition, the dopant ions with a larger mass may have higher doping energy. In one embodiment, the dopant gas may include As. On the other hand, when the selected dopant ions have a smaller mass including e.g., B ions, P ions, F ions, and/or C ions, the dopant ions may have less doping energy.

Figure 7:
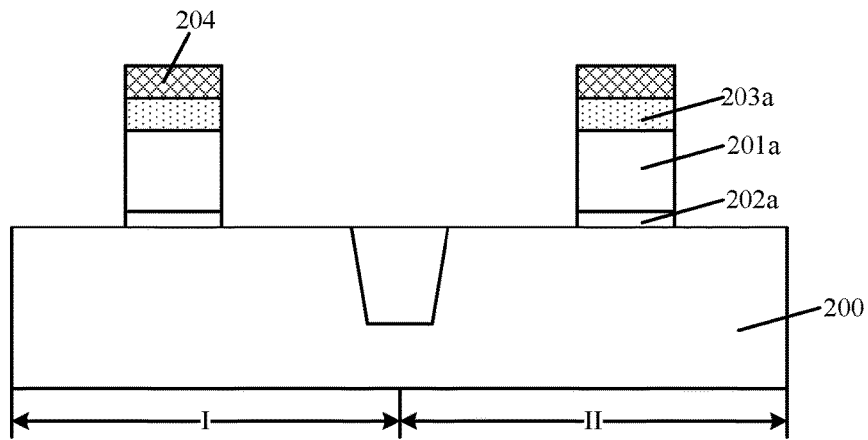

In FIG. 7, after forming the modified film 203, the dummy gate film 201 (shown in FIG. 6) along with the modified film 203 may be etched to expose a surface of the substrate 200 to form a dummy gate layer 201a and a modified layer 203a over the surface of the substrate 200. The modified layer 203a is on the dummy gate layer 201a.

The dummy gate layer 201a may be formed by the following exemplary steps. A mask layer 204 may be formed on a surface portion of the modified film 203 and may be used as an etch mask to etch the modified film 203 and the dummy gate film 201 to expose the surface of the substrate 200. The modified layer 203a and the dummy gate layer 201a can then be formed over the substrate 200.

The area covered by the mask layer 204 may correspond to an area for forming a gate electrode layer. The mask layer 204 may be made of a material including silicon nitride, silicon oxide, carbon-doped silicon oxynitride, and/or boron-doped silicon oxynitride. The mask layer 204 may have a thickness of about 10 angstroms to about 200 angstroms. The mask layer 204 may be formed by first forming a mask material film on the modified film 203. On the mask material film, a patterned layer may be formed. The patterned layer may cover an area corresponding to the dummy gate layer 201a. The patterned layer may be used as an etch mask to etch the mask material film to expose surface portions of the modified film 203 to form the mask layer 204.

The mask material film may be formed by an atomic layer deposition process or a chemical vapor deposition process. The patterned layer may be a patterned photoresist layer. In some cases, the patterned layer may be a mask pattern formed using a multi-patterning process including, e.g., a self-aligned double patterning (SADP) process.

An etching process for etching the modified film 203 and the dummy gate film 201 may include an anisotropic dry etching process. The anisotropic dry etching process may use parameters including: an etching gas including fluorocarbon gas, $O_2$, Ar, He, and/or $N_2$; a flow rate of the etching gas of about 50 sccm to about 1000 sccm; a gas pressure of about 1 mtorr to about 50 mtorr; a bias voltage of about 10V to about 800V; a power of about 100 W to about 800 W, a temperature of about 40° C. to about 200° C.; and a fluorocarbon gas including $CF_4$, $C_3F_8$, $C_4F_8$, $CH_2F_2$, $CH_3F$, and/or $CHF_3$.

In one embodiment, a dummy gate dielectric film 202 is formed between the dummy gate film 201 and the substrate 200. After etching the dummy gate film 201 to form the dummy gate layer 201a, the dummy gate dielectric film 202 (shown in FIG. 6) may be etched to expose a surface of the substrate 200 to form a dummy gate dielectric layer 202a. The dummy gate dielectric layer 202a can protect the substrate 200 when subsequently removing the dummy gate layer 201a.

In another embodiment, a shielding dielectric film may be formed between the dummy gate film and the substrate. The gate dielectric film may be formed on the shielding dielectric film. The gate dielectric film may be made of a material including a high-K dielectric material having a dielectric constant greater than 4. The shielding dielectric film may be made of a material including silicon oxide. After etching the dummy gate film to expose the gate dielectric film, the gate dielectric film and the shielding dielectric film can be etched to expose the surface of the substrate to form the gate dielectric layer and the shielding dielectric layer. Since the shielding dielectric layer and the gate dielectric layer are formed between the dummy gate layer and the substrate, subsequently the gate electrode layer may be formed directly by filling the opening on the gate dielectric layer after removing the dummy gate layer to expose the gate dielectric layer.

Figure 8:
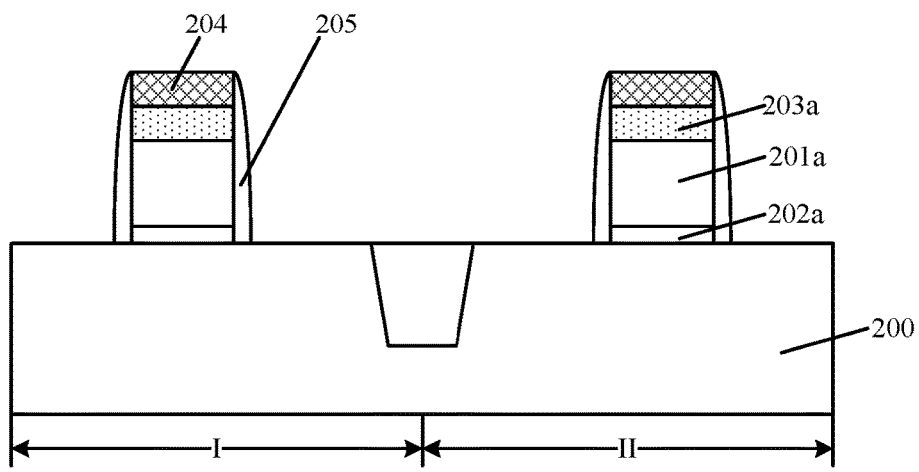

In FIG. 8, a first sidewall spacer 205 may be formed on sidewall surface of the dummy gate layer 201a and the sidewall surface of the modified layer 203a.

The first sidewall spacer 205 may be used to define the distance and location of the source/drain regions with respect to the dummy gate layer 201a. The first sidewall spacer 205 may be made of a material including SiN, SiON, SiOBN, SiOCN, $SiO_2$, or a combination thereof. The first sidewall spacer 205 may have a thickness ranging from about 10 angstroms to about 30 angstroms.

The first sidewall spacer 205 may be formed by, for example, forming a first sidewall spacer film on the substrate 200, the dummy gate layer 201a, the modified layer 203a, and the mask layer 204. The first sidewall spacer film may be etched back until a surface of the mask layer 204 and the substrate 200 is exposed. The first sidewall spacer 205 may then be formed. The first sidewall spacer film may be formed by a thermal oxidation process, an atomic layer deposition process, and/or a chemical vapor deposition process. The etch-back process may include an anisotropic over-etching process.

Figure 9:
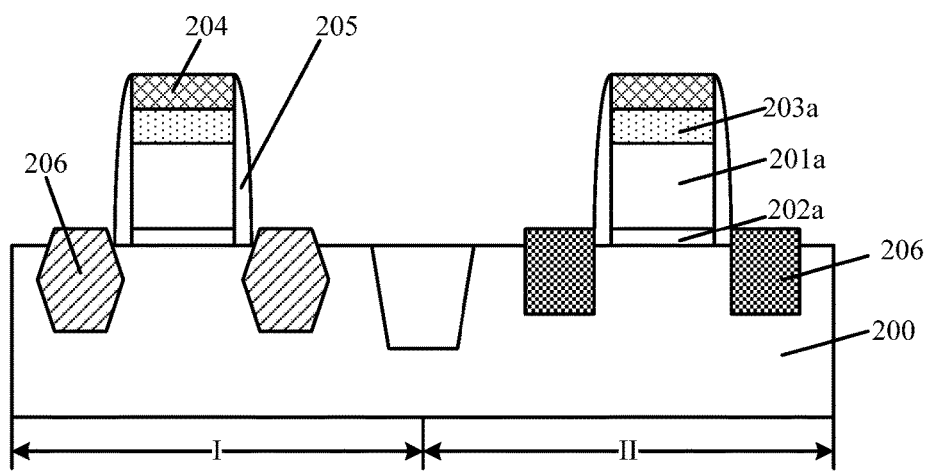

In FIG. 9, source/drain regions may be formed in the substrate 200 and on both sides of the first sidewall spacer 205 and the dummy gate layer 201a.

In one embodiment, a stress layer 206 may be formed within the substrate 200 on both sides of the dummy gate layer 201a. The stress layer 206 may form the source/drain regions.

The stress layer 206 may be formed by, for example, forming a patterned layer on the surface of the substrate 200 to expose the mask layer 204, the first sidewall spacer 205, and the substrate surface portions on both sides of the dummy gate layer 201a. The patterned layer may be used as an etch mask to etch the substrate 200 to form the second openings in the substrate 200. The stress layer 206 is then formed within the second openings.

The stress layer 206 may be made of a material including silicon germanium or silicon carbide. The stress layer 206 may be formed by a selective epitaxial deposition process. When the transistor is a PMOS transistor, the stress material 206 may be a silicon germanium layer. When the transistor is an NMOS transistor, the stress layer may be a silicon carbide layer.

In one embodiment, the first region I may be used for forming PMOS transistors, and therefore, the stress layer 126 formed in the first region I may be made of silicon germanium, and the stress layer may be doped with P-type ions to form the source/drain regions.

In one embodiment, the sidewall of the second opening in the first region I together with the top surface of the fin may form Σ (Sigma) shape. The sidewall of the second opening in the first region I may have an apex angle extended into the fin under the bottom of the gate electrode layer 201.

In one embodiment, the surface of the substrate 200 has a crystal orientation <100> or <110>. The second opening in the first region I may be formed by, for example, forming a patterned layer to cover the second region II and to expose the mask layer 204, the first sidewall 205, and surface portions of the substrate 200 on both sides of the dummy gate layer 201a in the first region I. The patterned layer may then be used as an etch mask for an anisotropic dry etching process to form the openings in the fin 211 on both sides of the gate electrode layer 201 and the sidewall spacers 205a. The sidewalls of the opening are perpendicular to the top surface of the fin 211. After the anisotropic dry etching process, an anisotropic wet etching process may be performed to etch the sidewalls and bottom of the opening to thus form the second opening. The second opening has a sidewall that forms Σ shape with the top surface of the fin 211.

The anisotropic dry etching process may include an etching gas including a mixed gas of chlorine gas, chlorine, hydrogen bromide, and/or hydrogen bromide; a hydrogen bromide flow of about 200 sccm to about 800 sccm, a chlorine gas flow rate of about 20 sccm to about 100 sccm, an inert gas flow rate of about 50 sccm to about 1,000 sccm, a pressure in the etching chamber of about 2 mtorr to about 200 mtorr, and an etching time of about 15 seconds to about 60 seconds.

The anisotropic wet etching process may use an etching solution of an alkaline solution including one or more of potassium hydroxide (KOH), sodium hydroxide (NaOH), lithium hydroxide (LiOH), aqueous ammonia (NH$_4$OH), and/or tetramethylammonium hydroxide (TMAH).

When the stress layer 206 in the first region I is made of silicon germanium, the stress layer 206 may be formed by a selective epitaxial deposition process. The selective epitaxial deposition process may be performed having a temperature of about 500 degrees Celsius to about 800 degrees Celsius, a pressure of about 1 Torr to about 100 Torr, a processing gas including a silicon source gas (e.g., SiH$_4$ and/or SiH$_2$Cl$_2$) and/or a germanium source gas (GeH$_4$), a flow of the silicon-source gas or germanium-source gas of about 1 sccm to about 1000 sccm, and the processing gas further including HCl and H$_2$ with a HCl flow rate of about 1 sccm to about 1,000 sccm, and a H$_2$ flow rate of about 0.1 slm to about 50 slm.

In one embodiment, when using the selective epitaxial deposition process to form the stress layer 206, the stress layer 206 may be in situ doped with P-type ions. In another embodiment, after forming the stress layer 206, an ion implantation process may be performed on the stress layer 206 and portions of the substrate 200, on both sides of the dummy gate layer 201a, to form the source and drain regions. The implanted ions may be P-type.

In one embodiment, the second region II may be used for forming the NMOS transistor, and therefore, the stress layer 206 in the second region II may be made of silicon carbide, and the stress layer 206 may be doped with N-type ions to form the source and drain regions.

The sidewall of the second openings in the second region II may be perpendicular to the top surface of the fin 211. A first opening may be formed in the second region II by an anisotropic dry etching process. The anisotropic dry etching process may include: an etching gas including chlorine gas, hydrogen bromide, or a mixture thereof, a hydrogen bromide flow of about 200 sccm to about 800 sccm, a chlorine gas flow rate of about 20 sccm to about 100 sccm, an inert gas flow rate of about 50 sccm to about 1000 sccm, an etch chamber pressure of about 2 mTorr to about 200 mTorr, and an etching time of about 15 seconds to about 60 seconds.

The stress layer 206 in the second region II may be made of silicon carbide. The stress layer 206 may be formed using a selective epitaxial deposition process. The selective epitaxial deposition process may include: a temperature of about 500 degrees Celsius to about 800 degrees Celsius, a pressure of about 1 Torr to about 100 Torr, and a processing gas including a silicon source gas (e.g., SiH$_4$ and/or SiH$_2$Cl$_2$) and a carbon source gas (e.g., CH$_4$, CH$_3$Cl and/or CH$_2$Cl$_2$) having a flow rate of the silicon-source gas and the carbon source gas of about 1 sccm to about 1000 sccm, the processing gas further including HCl and H$_2$ having a HCl flow rate of about 1 sccm to about 1,000 sccm, and a H$_2$ flow rate of about 0.1 slm to about 50 slm.

In one embodiment, when using the selective epitaxial deposition process to form the stress layer 206, N-type dopant ions may be in-situ doped in the stress layer 206. In another embodiment, after forming the stress layer 206, ion implantation process may be performed on the stress layer 206 and portions of the substrate 200, on both sides of the dummy gate layer 201a, to form the source and drain regions. The implanted ions may be N-type.

When the source and drain regions are formed by an ion implantation process, the first sidewall spacer 205 may be removed after forming the stress layer 206. After removal of the first sidewall spacer 205, a second sidewall spacer may be formed on the sidewall surface of the dummy gate layer 201a and the modified layer 203a. The second sidewall spacer and the mask layer 204 may be used as an etch mask for ion implantation into the stress layer 206 and portions of the substrate 200, on both sides of the dummy gate layer 201a, to form the source and drain regions.

Since the first sidewall spacer 205 may be exposed when forming the second opening and the stress layer 206, the first sidewall spacer 205 may be damaged and thus thinned, which in turn may result in a too-short distance between the source/drain regions and the dummy gate layer. Short channel effect may then be generated. Therefore, there is a need to remove the first sidewall spacer 205, and to form a second sidewall spacer having a more precise thickness, and to precisely control a distance between the source (or the drain) region and the dummy gate layer.

Further, a high-temperature process may be performed during formation of the stress layer 206 and the source/drain regions. The high-temperature process may facilitate to activate the doped ions in the modified layer 203 to provide uniform distribution of the doped ions, such that a uniform planarization rate may be obtained during the subsequent planarization process. Meanwhile, after the high-temperature process, the lattice structure of the modified layer 203a may still be different than dummy gate layer 201a, and the lattice structure of the modified layer 203a may have a loose lattice arrangement. This can still provide an increased planarization rate for the subsequent planarization process on the modified layer 203a.

Figure 10:
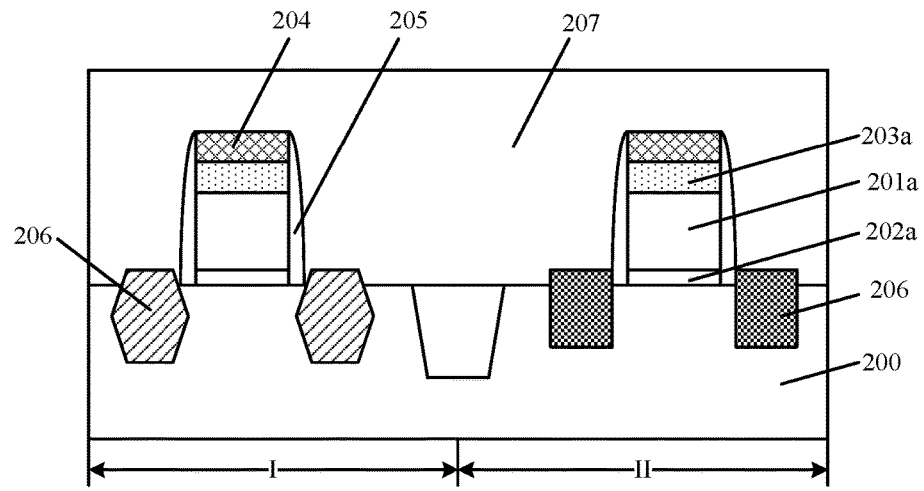

In FIG. 10, after forming the source/drain regions, a dielectric film 207 is formed on surfaces of the substrate 200, the source/drain regions, and the dummy gate layer 201a.

The dielectric film 207 may be made of a material including silicon oxide, silicon nitride, silicon oxynitride, low K dielectric materials (e.g., having a dielectric constant from about 2.5 to about 3.9), and/or ultra-low-K dielectric materials (e.g., having a dielectric constant below about 2.5). The dielectric film 207 may be formed by, for example, a chemical vapor deposition process, a physical vapor deposition process, and/or an atomic layer deposition process. The dielectric film 207 may have a thickness greater than or equal to the thickness of the dummy gate layer 201a.

In the present embodiment, the dielectric film 207 may be formed by a fluid chemical vapor deposition (FCVD) process such that materials of the dielectric film 207 may be sufficiently filled into the grooves between adjacent dummy gate layers 201a. For example, the dielectric film 207 may be made of a silicon oxide material. In other embodiments, the dielectric film 207 may be formed by a high density plasma deposition (HDP) process, and/or a high aspect ratio process (HARP).

The chemical vapor deposition process may be performed by first applying a precursor on surface of the substrate 200, the first sidewall spacer 205 and the dummy gate layer 201a. The precursor may be a silicon-containing precursor including, e.g., silane or tetraethylorthosilicate (TEOS). The precursor may be a fluid and therefore have a fluidity, which allows an easy access into grooves between adjacent dummy gate layers 201a. An oxygen-containing gas may be used to process the precursor, so that the precursor may be oxidized to form a solid silicon oxide material to form the dielectric film 207.

In one embodiment, prior to forming the dielectric film 207, a stop layer may be formed on surfaces of the substrate 200, the source/drain regions, and the dummy gate layer 201a. The dielectric film 207 may then be formed on the stop layer. The dielectric film 207 and the stop layer may be made of different materials. The stop layer may be formed as an etching stop layer used for the etching process to form the conductive structures on surfaces of the source/drain regions after subsequently forming the gate electrode layer.

The stop layer may be made of a material including SiN, SiON, SiOCN, SiOBN, or a combination thereof. The stop layer may have a thickness of about 10 angstroms to about 200 angstroms. The stop layer may be formed by, e.g., an atomic layer deposition process or a chemical vapor deposition process.

Figure 11:
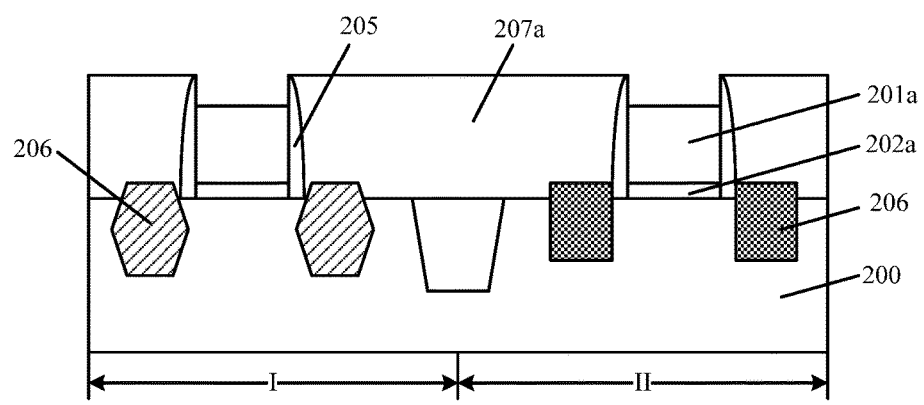

In FIG. 11, the dielectric film 207 (shown in FIG. 10) is planarized to expose the dummy gate layer 201a to form a dielectric layer 207a. The planarization process on the dielectric film 207 may have a planarization rate lower than the modified layer 203a. The surface of the dielectric layer 207a is higher than the surface of the dummy gate layer 201a.

The planarization process on the dielectric film 207 may include, for example, a chemical mechanical polishing process. In the present embodiment, the mask layer 204 may be formed on surface of the dummy gate layer 201a, and may also be planarized by the exemplary chemical mechanical polishing process, until the top surface of the dummy gate layer 201a is exposed. In one embodiment, a stop layer may be formed on the top surface of the mask layer 204. In this case, the planarization process on the dielectric film 207 may also planarize the stop layer on the top surface of the mask layer 204.

In one embodiment, the modified layer 203a may be formed on the top surface the dummy gate layer 201a and have doped ions. The doped ions may have changed the lattice state/structure of the upper portion of the dummy gate layer 201a and the resulted, modified layer 203a may have loose lattice structure. Then the chemical mechanical polishing process on the modified layer 203a may have a planarization rate higher than the dielectric film 207. In this manner, after the planarization process, the formed dielectric layer 207a may have a surface higher than the surface of the dummy gate layer 201a. Formation of recesses on surface of the dielectric layer 207a is less likely to occur, material residues of gate electrode layer may not be remained on the dielectric layer 207a during a subsequent removal of the dummy gate layer 201a and filling of the gate electrode layer. Short contact between gate electrode layers of adjacent transistors can be prevented. The formed transistor may have stable performance.

Moreover, because no or less recesses are formed on surface of the dielectric layer 207a, the dielectric layer 207a may have a more uniform and controllable thickness. As such, when subsequently removing the dummy gate layer and forming the gate electrode layer, the formed gate electrode layer may have a more uniform and precise thickness. Morphologies of the formed transistors may be more accurate and easy to control. The transistors may have a more uniform and stable performance.

Specifically, in an exemplary CMP process, when the planarization process proceeds to after detecting that the chemical composition containing in the dummy gate layer 201a is in the polishing liquid (i.e., a slurry), an over-planarization process may be performed to fully expose the top surface of the dummy gate layer 201a. The over-planarization process may provide a planarization rate on the modified layer 203a higher than the planarization rate on the dielectric layer 207a. Therefore, after the over-planarization process, the dielectric layer 207a is thinned less, as compared with the modified layer 203a, so that the dielectric layer 207a has a surface higher than the surface of the dummy gate layer 201a (with the modified layer 203a removed). In addition, the thickness of the dielectric layer 207a may not be overly thinned and the subsequent formed gate electrode layer may have a desired thickness. When the dummy gate layer 201a needs to be removed, even if the surface of the dummy gate layer 201a has surface recesses with respect to the surface dielectric layer 207a, dimensions of the subsequently formed gate electrode layer may not be affected.

Figure 12:
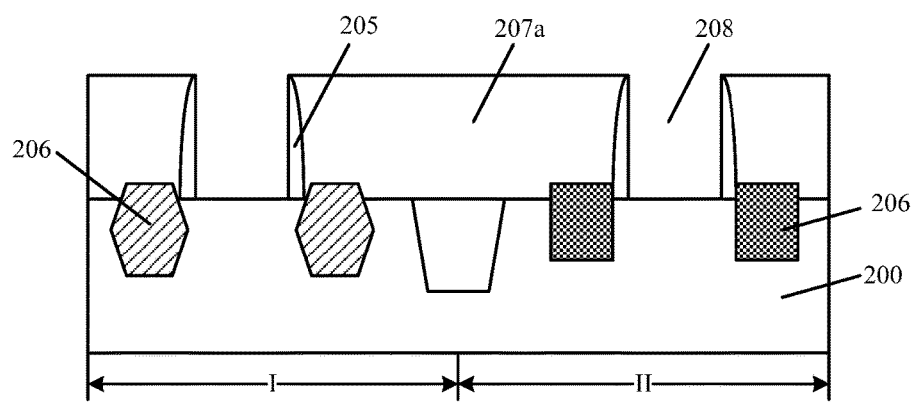

In FIG. 12, after forming the dielectric layer 207a, the dummy gate layer 201a (e.g., FIG. 11) may be removed. A first opening 208 may be formed within the dielectric layer 207a.

The first opening 208 may be used for forming a gate electrode layer. The dummy gate layer 201a may be removed by a wet etching process or dry etching process. The dry etching process may be an isotropic dry etching process or an anisotropic dry etching process. The wet etching may be an isotropic wet etching process.

In one embodiment, the dummy gate layer 201a may be made of a material of polysilicon. The dry etching process may use an etching gas including chlorine, hydrogen bromide, or a combination thereof. The etching solution of the wet etching process may include one or both of nitric acid solution and hydrofluoric acid solution.

In one embodiment, the dummy gate dielectric layer 202a may be formed between the dummy gate layer 201a and the substrate 200 and may be removed after the removal of dummy gate layer 201a to expose the surface of the substrate 208 at the bottom of the first opening 200.

In one embodiment, the dummy gate dielectric layer 202a may be formed between the dummy gate layer 201a and the substrate 200. The dummy gate dielectric layer 202a may be able to protect the surface of the substrate 200 when removing the dummy gate electrode layer 201a. Because the dummy gate dielectric layer 202a and the substrate 200 have a large etching selectivity, when removing the dummy gate dielectric layer time 202a, the etching process has limited damages to the surface of the substrate 200. In one embodiment, the removal of the dummy gate dielectric layer 202 includes a wet etching process. This wet etching process uses a hydrofluoric acid solution as an etchant. The wet etching process may have little or no effect on the surface of the substrate 200.

In another embodiment, a shielding dielectric layer and the gate dielectric layer may be formed between the dummy gate layer and the substrate. In this case, only the dummy gate layer needs to be removed and surface of the gate dielectric layer may be exposed to form the first opening within the dielectric layer.

Figure 13:
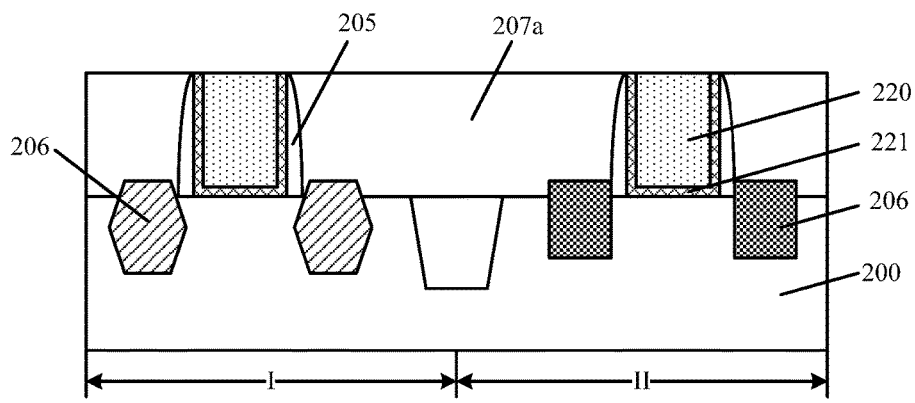

In FIG. 13, a gate electrode layer 220 is formed in the first opening 208 (FIG. 12) and fully fills the first opening 208.

The dummy gate dielectric layer 202a may be formed between the dummy gate layer 201a and the substrate 200. After removal of the dummy gate layer 201a, the dummy gate dielectric layer 202a may be removed and the first opening 208 may be exposed at the surface of the substrate 200. A gate dielectric layer 221 may be formed on the bottom surface of the first opening 208. The gate electrode layer 220 may be formed on surface of the gate dielectric layer 221.

In one embodiment, after forming the gate dielectric layer 221, a shielding dielectric layer may be formed on the bottom of the first opening 208, i.e., on a surface of the substrate 200. The gate dielectric layer 221 may be formed on surface of the shielding dielectric layer. The shielding dielectric layer may be made of a material including silicon oxide, and may be formed by a chemical vapor deposition process and/or an atomic layer deposition process.

The gate dielectric layer 221 may be made of a high-k material dielectric material. The dielectric constant of the high-K dielectric material may be greater than or equal to 4. The high-k dielectric material may include Hf-based dielectric material, which may include, for example, $HfO_2$ and/or $HfSiO_4$. The gate electrode layer 220 may be made of a metal material, which may include, for example, copper, tungsten, aluminum, titanium, titanium nitride, tantalum, tantalum nitride, or a combination thereof.

The gate dielectric layer 221 and the gate electrode layer may be formed by, forming a gate dielectric film on the dielectric layer 207a, and on a bottom surface and a sidewall surface of the first opening 208. A gate electrode film may be deposited on surface of the gate dielectric film. The gate electrode film and the gate dielectric film may be planarized to expose surface of the dielectric layer 207a. The gate dielectric layer 221 and the gate electrode layer 220a may be formed in the first opening 208.

In some embodiments, a work function layer can be formed between the gate electrode layer 220 and the gate dielectric layer 221. The work function layer may be used for adjusting the threshold voltage of the formed fin field effect transistor, for example. The work function layer may be formed by, for example, depositing a work function film on the gate dielectric film, and depositing the gate electrode film on surface of the work function film. During the above described planarization process, the work function film may also be planarized to form a work function layer.

In one embodiment, when a PMOS transistor is formed in the first region I, and an NMOS transistor is formed in the second region II, the work function layer may be formed having different materials in the first region I and the second region II to accommodate transistors with different needs of the work function.

As such, the present disclosure provides a transistor and a method for forming the transistor. For example, after forming a dummy gate film used for forming a dummy gate layer on surface of a substrate, an upper portion of the dummy gate film may be ion-doped to form a modified film. After subsequently forming a dielectric film between the substrate and the dummy gate layer, a planarization process may be conducted on the modified film to form a modified layer with a planarization rate greater than that conducted on the dielectric film to form a dielectric layer. As a result, the dielectric layer may have a surface above the surface of the formed dummy gate layer. Thickness of the dielectric layer will not be overly thinned, relative to the total thickness of the dummy gate layer and the modified layer. Recesses formed on the dielectric layer with respect to the dummy gate layer can be avoided. After subsequent removal of dummy gate layer and during formation of the gate electrode layer, metal materials may not be remained or resided on surface of the dielectric layer. Short contact between gate electrode layers of adjacent transistors may not be generated. In addition, because thickness of the dielectric layer relative to the total thickness of the dummy gate layer and the modified layer is not overly thinned, this can ensure, after the subsequent removal of the dummy gate layer, thickness of the gate dielectric layer, formed in the dielectric layer, and the gate electrode layer can be accurately controlled to provide the transistor with desirable morphologies, homogeneously stable performance, and improved reliability.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a transistor, comprising:
providing a substrate;
forming a dummy gate film on the substrate;
doping an upper portion of the dummy gate film to convert into a modified film on a remaining un-doped dummy gate film;
etching the modified film and the remaining un-doped dummy gate film to expose a surface of the substrate to form a modified layer and an un-doped dummy gate layer on the substrate;
forming a first sidewall spacer on a sidewall surface of each of the un-doped dummy gate layer and the modified layer;
forming source/drain regions in the substrate and on both sides of the first sidewall spacer and the dummy gate layer;
forming a dielectric film on each of the substrate, the source/drain regions, and the dummy gate layer; and
planarizing the dielectric film and the modified layer in a planarization process that the dielectric film has a planarization rate lower than the modified layer, to remove the modified layer and a portion of the dielectric film, thereby exposing the un-doped dummy gate layer and providing a dielectric layer having a top surface higher than the exposed un-doped dummy gate layer.

2. The method according to claim 1, wherein the step of doping the upper portion of the dummy gate film includes an ion implantation process or a plasma doping process.

3. The method according to claim 2, wherein the ion implantation process or the plasma doping process includes:
a doping gas including B, $BF_2$, P, Ge, As, $N_2$, C, or a combination thereof,
a doping depth of about 10 Å to about 200 Å,
a doping concentration greater than $1E15$ atoms/$cm^3$, and
a doping energy of less than or equal to about 5 keV for the doping gas including B, $BF_2$, P, As, $N_2$, or C, and a doping energy of less than 40 keV for the doping gas including Ge.

4. The method according to claim 1, wherein the dummy gate layer is formed by:
forming a mask layer on the modified film,
using the mask layer as an etch mask to etch the modified film and the un-doped dummy gate film to expose the surface of the substrate, and
removing the mask layer when planarizing the dielectric film.

5. The method according to claim 1, further including:
after forming the dielectric layer, removing the dummy gate layer to form a first opening in the dielectric layer, and
filing the first opening with a gate electrode layer.

6. The method according to claim 5, further including:
a dummy gate dielectric layer formed between the substrate and the dummy gate layer,
after removing the dummy gate layer, removing the dummy gate dielectric layer to expose the surface of the substrate at a bottom of the first opening, forming a gate dielectric layer on the surface of the substrate at the bottom of the first opening, and
forming a gate electrode layer on the gate dielectric layer.

7. The method according to claim 6, further including:
prior to forming the gate dielectric layer, forming a shielding dielectric layer on the surface of the substrate at the bottom of the first opening,
wherein the gate dielectric layer is formed on the shielding dielectric layer.

8. The method according to claim 7, wherein:
the shielding dielectric layer is formed on the substrate,
the gate dielectric layer is on the shielding dielectric layer, wherein, after removing the dummy gate layer, the gate dielectric layer is exposed, and
the gate electrode layer is formed on the gate dielectric layer to fill the first opening.

9. The method according to claim 6, wherein:
the gate dielectric layer is made of a high-k dielectric material having a dielectric constant greater than or equal to 4.

10. The method according to claim 5, wherein:
the gate electrode layer is made of a metal including copper or aluminum.

11. The method according to claim 1, further including:
prior to forming the dummy gate film, forming a dummy gate dielectric film on the surface of the substrate,
forming the dummy gate film on the dummy gate dielectric film, and
after etching the dummy gate film to form the dummy gate layer, etching dummy gate dielectric film to expose the surface of the substrate to form a dummy gate dielectric layer.

12. The method according to claim 1, wherein:
prior to forming the source/drain regions, forming second openings on both sides of the first sidewall spacer and the dummy gate layer,
forming a stress layer in the second openings, and
doping a P-type or N-type ion in the stress layer to form the source/drain regions.

13. The method according to claim 12, wherein:
the stress layer is made of a material including silicon germanium or silicon carbide, and
the stress layer is formed by a selective epitaxial deposition process.

14. The method according to claim 12, wherein:
when the stress layer is made of a material including silicon germanium, the stress layer is doped with the P-type ion, and
when the stress layer is made of a material including silicon carbide, the stress layer is doped with the N-type ion.

15. The method according to claim 12, wherein:
after forming the stress layer, removing the first sidewall spacer, and
after removing the first sidewall spacer, forming a second sidewall spacer on the sidewall surface of each of the dummy gate layer and the modified layer.

16. The method according to claim 1, wherein:
the first sidewall spacer is made of a material including one or more of SiN, SiON, SiOBN, SiOCN, and $SiO_2$,
the first sidewall spacer has a thickness of about 10 angstroms to about 30 angstroms, and
the first sidewall spacer is formed by one or more of a thermal oxidation process, an atomic layer deposition process, and a chemical vapor deposition process.

17. The method according to claim 1, wherein:
the dielectric film is made of a material including silicon oxide, and
the dielectric film is formed by a chemical vapor deposition process, an atomic layer deposition process, and a chemical vapor deposition process.

18. The method according to claim 1, wherein:
the substrate is a planar substrate, and
the dummy gate layer is located on a surface of the planar substrate.

19. A method for forming a transistor, comprising:
providing a substrate;
forming a dummy gate film on the substrate;
doping an upper portion of the dummy gate film to convert into a modified film on a remaining dummy gate film;
etching the modified film and the remaining dummy gate film to expose a surface of the substrate to form a modified layer and a dummy gate layer on the substrate;
forming a first sidewall spacer on a sidewall surface of each of the dummy gate layer and the modified layer;
forming source/drain regions in the substrate and on both sides of the first sidewall spacer and the dummy gate layer;
forming a stop layer on the substrate, the source/drain regions, and the dummy gate layer
forming a dielectric film on the stop layer; and
planarizing the dielectric film and the modified layer to provide a dielectric layer, and to remove at least a portion of the stop layer on top of the dummy gate layer and the modified layer to expose the dummy gate layer, wherein the dielectric film has a planarization rate lower than the modified layer, and the formed dielectric layer has a surface higher than the exposed dummy gate layer.

20. A method for forming a transistor, comprising:
providing a substrate;
forming a dummy gate film on the substrate;
doping an upper portion of the dummy gate film to convert into a modified film on a remaining dummy gate film;
etching the modified film and the remaining dummy gate film to expose a surface of the substrate to form a modified layer and a dummy gate layer on the substrate;
forming a first sidewall spacer on a sidewall surface of each of the dummy gate layer and the modified layer;
forming source/drain regions in the substrate and on both sides of the first sidewall spacer and the dummy gate layer;
forming a dielectric film on each of the substrate, the source/drain regions, and the dummy gate layer; and
planarizing the dielectric film and the modified layer to provide a dielectric layer, and to remove the modified layer to expose the dummy gate layer, wherein the dielectric film has a planarization rate lower than the modified layer, and the formed dielectric layer has a surface higher than the exposed dummy gate layer, wherein:
the substrate includes a base substrate, a fin on the base substrate, and an isolation layer on a surface of the base substrate and covering sidewall portions of the fin,
the isolation layer has a surface lower than a top surface of the fin, and the dummy gate layer is across on the fin, and covering portions of the isolation layer, and a sidewall and a top surface of the fin.

* * * * *